US006812040B2

(12) United States Patent
Kyler et al.

(10) Patent No.: US 6,812,040 B2
(45) Date of Patent: Nov. 2, 2004

(54) METHOD OF FABRICATING A SELF-ALIGNED VIA CONTACT FOR A MAGNETIC MEMORY ELEMENT

(75) Inventors: Kelly Kyler, Mesa, AZ (US); Saied N. Tehrani, Tempe, AZ (US); John J. D'urso, Chandler, AZ (US); Gregory W. Grynkewich, Gilbert, AZ (US); Mark A. Durlam, Chandler, AZ (US); Brian Butcher, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 66 days.

(21) Appl. No.: 10/095,816

(22) Filed: Mar. 12, 2002

(65) Prior Publication Data

US 2003/0175997 A1 Sep. 18, 2003

(51) Int. Cl.[7] .............................................. H01L 21/00
(52) U.S. Cl. ............................ 438/3; 438/612; 365/158
(58) Field of Search ................................. 438/612, 613, 438/614, 3, 238, 381, 171, 210, 48; 257/421–425; 365/48, 50, 55, 66, 117, 158, 171, 173

(56) References Cited

U.S. PATENT DOCUMENTS 6,165,803 A  * 12/2000 Chen et al. ..................... 438/3
6,180,523 B1     1/2001 Lee et al.
6,211,090 B1     4/2001 Durlam et al.
6,413,788 B1  *  7/2002 Tuttle ............................ 438/3
6,555,858 B1  *  4/2003 Jones et al. ................. 257/295
2002/0097600 A1 * 7/2002 Ning .......................... 365/171

FOREIGN PATENT DOCUMENTS

EP       1 085 586 A2    3/2001
WO     WO 02/19338 A1    3/2002

OTHER PUBLICATIONS

Wang et al., "Magnetostatic coupline in spin dependent tunnel junctions," IEEE Transactions on Magnetics, vol. 36, No. 5, Sep. 5, 2000, pp. 2802–2805.

* cited by examiner

*Primary Examiner*—Chandra Chaudhari
*Assistant Examiner*—Thanhha Pham
(74) *Attorney, Agent, or Firm*—Ingrassia Fisher & Lorenz PC

(57) ABSTRACT

A method of fabricating a magnetoresistive random access memory device comprising the steps of providing a substrate, forming a conductive layer positioned on the substrate, forming a magnetoresistive random access memory device positioned on conductive layer, forming a metal cap on the magnetoresistive random access memory device, and electroless plating a bump metal layer on the metal cap. The bump metal layer acts as a self-aligned via for a bit line subsequently formed thereon.

32 Claims, 2 Drawing Sheets

METHOD OF FABRICATING A SELF-ALIGNED VIA CONTACT FOR A MAGNETIC MEMORY ELEMENT

This invention was made with Government support under Agreement No. MDA972-96-3-0016 awarded by DARPA. The Government has certain rights in the invention.

FIELD OF THE INVENTION

This invention relates to semiconductor memory devices.

More particularly, the present invention relates to improved methods of fabricating semiconductor random access memory devices that utilize a magnetic field.

BACKGROUND OF THE INVENTION

A magnetoresistive random access memory (hereinafter referred to as "MRAM") device has a structure which includes ferromagnetic layers separated by a non-ferromagnetic layer. Information is stored as directions of magnetization vectors in magnetic layers. Magnetic vectors in one magnetic layer, for instance, are magnetically fixed or pinned, while the magnetization direction of the other magnetic layer is free to switch between the same and opposite directions which are called "Parallel" and "Anti-parallel" states, respectively. In response to Parallel and Anti-parallel states, the magnetic memory element represents two different resistances. The resistance indicates minimum and maximum values when the magnetization vectors of two magnetic layers point in substantially the same and opposite directions, respectively. Accordingly, a detection of changes in resistance allows an MRAM device to provide information stored in the magnetic memory element.

A MRAM device integrates magnetic memory elements and other circuits, for example, a control circuit for magnetic memory elements, comparators, for detecting states in a magnetic memory element, input/output circuits, etc. These circuits are fabricated in the process of complimentary metal oxide semiconductor (hereinafter referred to as "CMOS") technology in order to lower the power consumption of the MRAM device. The CMOS process requires high temperature steps which exceeds 300° C. for depositing dielectric and metal layers and annealing implants, for example.

Magnetic layers employ ferromagnetic materials such as nickel-iron, cobalt-iron, and nickel-iron-cobalt which require processing below 300° C. in order to prevent intermixing of magnetic materials caused by high temperatures. Accordingly, magnetic memory elements need to be fabricated at a different stage after CMOS processing.

Further, magnetic memory elements contain components that are easily oxidized and also sensitive to corrosion. To protect magnetic memory elements from degradation and keep the performance and reliability of the MRAM device, a passivation layer is formed over magnetic memory elements.

In addition, a magnetic memory element includes very thin layers, some of which are tens of angstroms thick. The performance of the magnetic memory element is sensitive to the surface conditions on which magnetic layers are deposited. Accordingly, it is necessary to make a flat surface to prevent the characteristics of a MRAM device from degrading. Also, magnetic memory elements are typically very small which makes it extremely difficult to connect the magnetic memory element to circuitry by using photolithography processes where the alignment tolerances are tight.

Further, the materials comprising the ferromagnetic layers are difficult to etch because they are typically non-volatile in conventional low temperature plasmas and are very thin which makes them sensitive to corrosion from conventional chlorine based chemistries.

It would be highly advantageous, therefore, to remedy the foregoing and other deficiencies inherent in the prior art.

SUMMARY OF THE INVENTION

To achieve the objects and advantages specified above and others, an improved method of fabricating a MRAM device with a self-aligned via is disclosed. The method involves forming magnetic memory elements on circuitry for controlling operations of magnetic memory elements. First, the circuitry is formed on a substrate under the CMOS process which requires a heat treatment of 300° C. or more. While fabricating the circuitry, conductive lines are also formed, which are used to create magnetic fields for writing and/or reading states in the magnetic memory element. The metal lines may or may not be enclosed by high permeability material such as a permalloy layer which facilitates magnetic fields to concentrate on the magnetic memory element. After completion of the circuitry, a surface of a layer including the circuitry is polished by the chemical mechanical polishing (hereinafter referred to as "CMP") process which produces a flat surface on the layer including the circuitry, then the magnetic memory element has a metal cap formed thereon. The flat surface prevents the characteristics of the magnetic memory element from degrading. Fabrication of the magnetic memory element after the CMOS process improves the performance and reliability of the magnetic memory element and avoids thermal degradation of the magnetic memory element.

Further, the metal cap on the MRAM device is used as a seed layer to electrochemically deposit a bump metal layer. By using the metal cap as the seed layer, difficult and expensive photolithography processing steps typically used to form an electrically conductive via are avoided. A dielectric layer is deposited on the exposed surface and CMP or a similar process is used to expose the bump metal layer and form a flat surface wherein a bit line is formed adjacent to the bump metal layer.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings.

DETAILED DESCRIPTION OF THE PREFERRED EMBODIMENT

Figure 1:
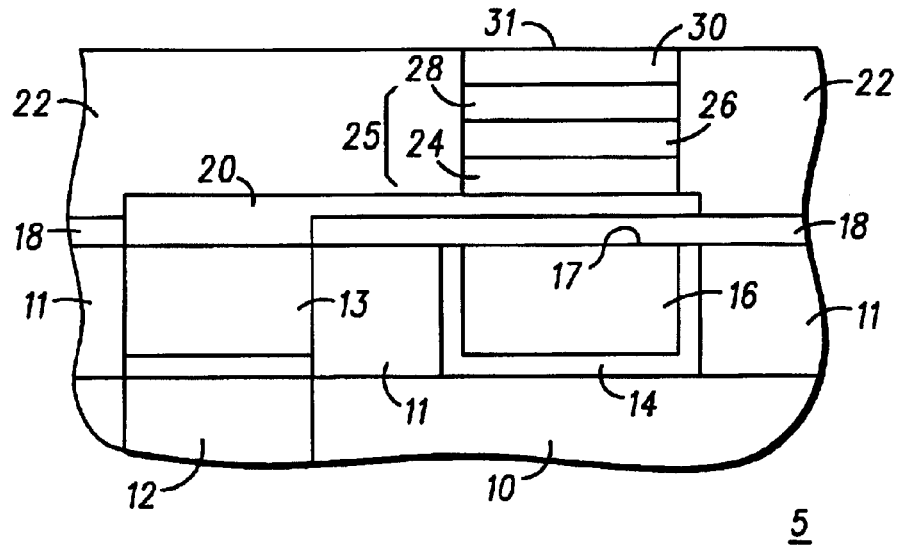
FIGS. 1 through 4 are simplified cross-sectional views illustrating several steps in a method of fabricating a MRAM device with a self-aligned via in accordance with the present invention.

Turn now to FIG. 1, which illustrates a simplified cross-sectional view of a partially fabricated MRAM cell 5 with a self-aligned via contact in accordance with the present invention. MRAM cell 5 includes a substrate 10 onto which a circuit (not shown) for controlling the operation of a MRAM device 25 is positioned. The circuit includes, for instance, NMOS switching transistors which are fabricated by the well known CMOS process. Other circuit elements, for example, input/output circuits, data/address decoders, and comparators, may be contained in the MRAM device, however they are omitted from the drawings for simplicity. Further, MRAM cell 5 includes a plug conductor 12 positioned on substrate 10.

A dielectric layer 11 is positioned on substrate 10 and plug conductor 12 and patterned and etched to form a metal layer 13 positioned on plug conductor 12. Dielectric layer 11 typically includes silicon oxide or another suitable dielectric material. Plug conductor 12 and metal layer 13 allow electrical contact from the circuit to subsequent layers grown thereon as will be discussed presently.

Further, dielectric layer 11 is also patterned and etched to form a digit line 16 which is positioned on substrate 10 and proximate to the circuit. Digit line 16 carries a current to generate a magnetic field which causes magnetic memory elements to store states. A thin field focusing layer 14 partially surrounds digit line 16 except for a top surface 17 directed toward MRAM device 25. Thin field focusing layer 14 has a high permeability and includes a material such as nickel-iron. In order to improve adhesion of thin field focusing layer 14 and to provide a barrier for nickel or iron diffusion into dielectric layer 11, a thin film of Ta or TaN or other such materials could be added between thin field focusing layer 14 and dielectric layer 11. Focusing layer 14, for example, facilitates the magnetic field to focus on a magnetic memory element placed proximate to digit line 16 through top surface 17 not covered by layer 14.

A dielectric layer 18 is positioned on the circuit and digit line 16 wherein a trench is formed in dielectric layer 18 adjacent to metal layer 13. Dielectric layer 18 behaves as an etch stop layer and typically includes aluminum nitride, aluminum oxide, silicon nitride, or another suitable dielectric material. Instead of etch stop layer 18, other techniques such as endpoint etches may be used. Dielectric layer 18 also serves to electrically isolate digit line 16 from MRAM device 25.

A conductive layer 20 is positioned within the trench and electrically connected to the circuit through metal layer 13 and plug conductor 12. Further, a portion of conductive layer 20 is positioned on dielectric layer 18 wherein dielectric layer 18 separates digit line 16 and conductive layer 20. In order to form magnetic memory elements on conductive layer 20, a top surface of conductor layer 20 needs to be smooth and flat because magnetic memory elements have very thin films, thereby a good condition for a magnetic memory element is attained. Conductive layer 20 has a flat surface formed by using chemical mechanical polishing or another similar technique. Conductive layer 20 typically includes a conductor metal, such as aluminum, aluminum alloys, copper, copper alloys, tantalum, Tantalum nitride, titanium, titanium nitride, titanium tungsten, and the like.

MRAM device 25 has a surface and is positioned on the flat surface of conductive layer 20 wherein MRAM device 25 is magnetically coupled to digit line 16. MRAM device 25 can be formed using techniques well known to those skilled in the art. One typical method is to deposit blanket layers of magnetic material then use a hard mask to define specific MRAM cells and surround the MRAM cells with a dielectric layer 22. A second method is by using a dielectric layer 22 positioned on conductive layer 20 and dielectric layer 18 to form a trench wherein MRAM device 25 is deposited. Dielectric layer 22 typically includes silicon dioxide or another suitable dielectric material. Also, it will be understood that dielectric layer 22 can include multiple layers, but is illustrated as a single layer in this embodiment for illustrative purposes only.

In the preferred embodiment, MRAM device 25 includes a pinned synthetic anti-ferromagnetic region 24 positioned on the flat surface of conductive layer 20 whereon a non-ferromagnetic spacer layer 26 is positioned. Further, a free ferromagnetic region 28 is positioned on non-ferromagnetic spacer layer 26. Non-ferromagnetic spacer layer 26 forms a quantum mechanical tunneling barrier between pinned synthetic anti-ferromagnetic region 24 and free ferromagnetic region 28 and typically includes aluminum oxide. It will be understood that the positions of pinned synthetic anti-ferromagnetic region 24 and free ferromagnetic region 28 could be reversed, but in this embodiment pinned synthetic anti-ferromagnetic region 24 is positioned adjacent to conductor layer 20 for illustrative purposes only. Pinned synthetic anti-ferromagnetic region 24, non-ferromagnetic spacer layer 26, and free ferromagnetic region 28 are illustrated in this embodiment as including a single layer for simplicity, but it will be understood that multiple layers could be used.

Further, in this specific embodiment, MRAM device 25 is a standard MRAM bit formed according to well-known practices in the art. While a standard MRAM bit is illustrated herein for convenience, it will be understood by those skilled in the art that many other types of semiconductor devices could be provided. Also, while a single MRAM bit is illustrated for convenience it should be understood that, for example, a complete array of devices or control/driver circuits around the periphery of an array of magnetic memory bits may be formed.

A metal cap 30 is positioned on the surface of MRAM device 25 in either of the above-mentioned processes. Metal cap 30 can include titanium-tungsten, tungsten, aluminum, or another suitable material. A portion of second dielectric layer 22 is removed to expose a flat surface 31 of metal cap 30. The portion of second dielectric layer 22 can be removed by using CMP or the like. Metal cap 30 is used as a seed layer as will be discussed presently.

Figure 2:
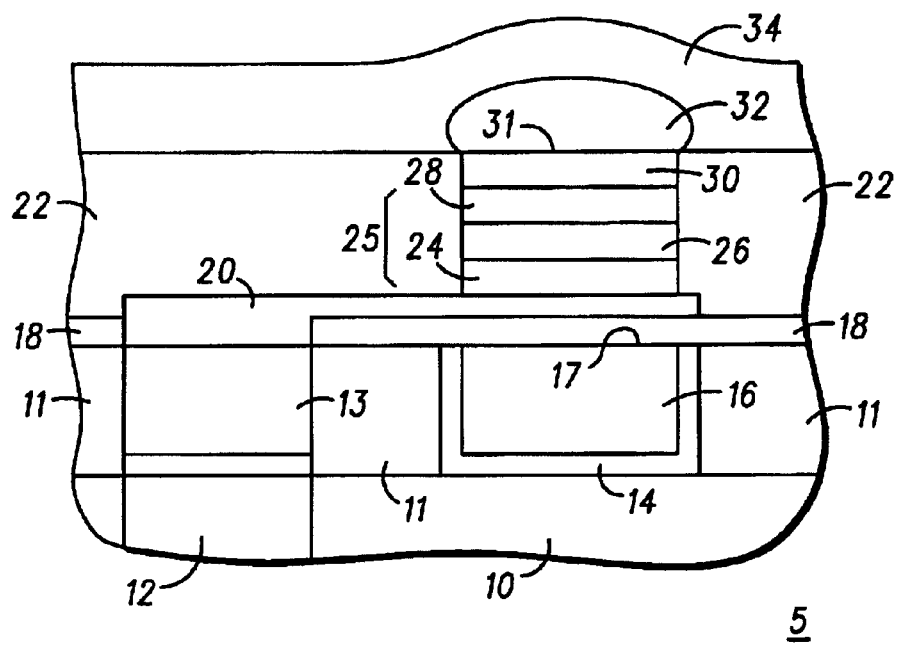

Turning now to FIG. 2, an optional process of making electrical contact with metal cap 30 is disclosed. MRAM cell 5 is immersed in an electrochemical deposition bath to form a bump metal layer 32 positioned on flat surface 31 of metal cap 30. Electrochemical deposition can include using electroless plating or immersion. Further, bump metal layer 32 includes a material more noble than the material included in metal cap 30 wherein bump metal layer 32 is substantially deposited only on metal cap 30 and forms a self-aligned via contact, as will be discussed presently. A dielectric layer 34 is then positioned on dielectric layer 22 and bump metal layer 32.

Figure 3:
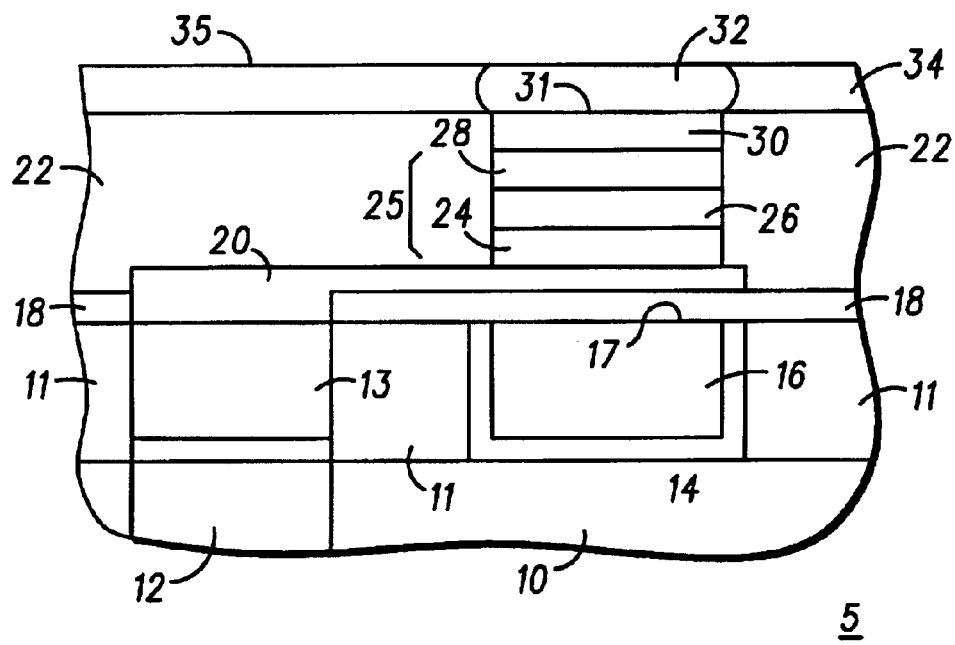
Figure 4:
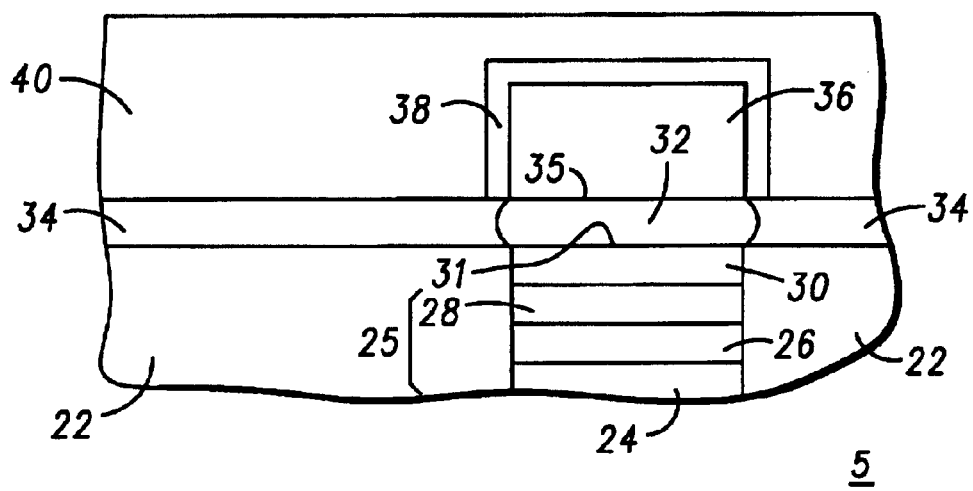

Turning now to FIG. 3, a portion of dielectric layer 34 is removed by using CMP or a similar technique to form a flat surface 35 on bump metal layer 32. Turn now to FIG. 4 which illustrates a partial cross-sectional view through bit line 16, MRAM device 25, and bump metal layer 32 as indicated by arrows 7-7. In FIG. 4, a bit line 36 is positioned on flat surface 35 of the bump metal layer 32, wherein bit line 36 is oriented perpendicular to digit line 16. Bit line 36 is partially surrounded by a high permeability layer 38 except a surface toward MRAM device 25. A dielectric layer 40 is then deposited on dielectric layer 34 and high permeability layer 38.

Thus, an improved and novel fabrication method for a magnetic memory element is disclosed. Circuitry for controlling magnetic memory element is fabricated first under the process that requires a high temperature processing, for example the CMOS process, and then the magnetic memory elements are formed on the circuitry. Accordingly, MRAM devices are integrated with circuit elements fabricated by the CMOS process and are prevented from degradation of metal composition caused by high temperatures. Further, electrochemical deposition is used to form a self-aligned via by using the hard mask layer as a seed layer. Because the MRAM devices are formed with a self-aligned conductive via contact, expensive and difficult photolithography processing steps are avoided.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A method of fabricating a magnetoresistive random access memory device with a self-aligned via contact, the method comprising the steps of:
   providing a substrate;
   forming a conductive layer with a flat surface, the conductive layer positioned on the substrate;
   forming a magnetoresistive random access memory device positioned on the flat surface of the conductive layer, the magnetoresistive random access memory device including a metal cap positioned on an upper surface;
   using an electrochemical deposition bath to form a bump metal layer positioned on the surface of the metal cap;
   depositing a first dielectric layer positioned on the conductive layer and the bump metal layer; and
   removing a portion of the first dielectric layer to expose a surface of the bump metal layer.

2. A method of fabricating a magnetoresistive random access memory device with a self-aligned via contact as claimed in claim 1 wherein the step of forming the magnetoresistive random access memory device includes the steps of:
   depositing a pinned synthetic antiferromagnetic region positioned on the flat surface of the conductive layer;
   depositing a non-ferromagnetic spacer layer positioned on the pinned synthetic anti-ferromagnetic region; and
   depositing a free ferromagnetic region positioned on the non-ferromagnetic spacer layer.

3. A method of fabricating a magnetoresistive random access memory device with a self-aligned via contact as claimed in claim 2 wherein the step of depositing the non-ferromagnetic spacer layer includes a step of forming a tunneling junction between the pinned synthetic anti-ferromagnetic region and the free ferromagnetic region.

4. A method of fabricating a magnetoresistive random access memory device with a self-aligned via contact as claimed in claim 1 wherein the step of using the electrochemical deposition bath includes using one of electroless plating and immersion.

5. A method of fabricating a magnetoresistive random access memory device with a self-aligned via contact as claimed in claim 1 wherein the step of removing a portion of the first dielectric layer includes using chemical mechanical polishing.

6. A method of fabricating a magnetoresistive random access memory device with a self-aligned via contact as claimed in claim 1 wherein the metal cap includes one of titanium-tungsten, tungsten, and aluminum.

7. A method of fabricating a magnetoresistive random access memory device with a self-aligned via contact as claimed in claim 1 wherein the bump metal layer includes a material more noble than the material included in the metal cap.

8. A method of fabricating a magnetoresistive random access memory device with a self-aligned via contact as claimed in claim 1 including in addition the step of depositing a second dielectric layer positioned on the first dielectric layer and the bump metal layer.

9. A method of fabricating a magnetoresistive random access memory device with a self-aligned via contact, the method comprising the steps of:
   providing a substrate;
   forming a circuit for controlling the operation of the magnetoresistive random access memory device positioned on the substrate;
   forming a digit line positioned proximate to the circuit;
   forming a first dielectric layer positioned on the circuit and the digit line;
   forming a trench in the first dielectric layer and proximate to the digit line;
   forming a conductive layer within the trench and electrically connected to the circuit, the conductive layer having a flat surface and wherein a portion of the conductive layer is positioned on the first dielectric layer and wherein the first dielectric layer separates the digit line and the conductive layer;
   forming a magnetoresistive random access memory device with a surface, the memory device positioned on the flat surface of the conductive layer wherein the magnetoresistive random access memory device is coupled to the digit line, the magnetoresistive random access memory device including a metal cap positioned on the surface;
   using an electrochemical deposition bath to form a bump metal layer positioned on the surface of the metal cap;
   depositing a second dielectric layer positioned on the conductive layer and the bump metal layer; and
   removing a portion of the second dielectric layer to expose a surface of the bump metal layer;

10. A method of fabricating a magnetoresistive random access memory device with a self-aligned via contact as claimed in claim 9 wherein the step of forming the magnetoresistive random access memory cell includes the steps of:
    depositing a pinned synthetic anti-ferromagnetic region positioned on the flat surface of the conductive layer;
    depositing a non-ferromagnetic spacer layer positioned on the pinned synthetic anti-ferromagnetic region; and
    depositing a free ferromagnetic region positioned on the non-ferromagnetic spacer layer.

11. A method of fabricating a magnetoresistive random access memory device with a self-aligned via contact as claimed in claim 10 wherein the step of depositing a non-ferromagnetic spacer layer includes a step of forming a tunneling junction between the pinned synthetic anti-ferromagnetic region and the free ferromagnetic region.

12. A method of fabricating a magnetoresistive random access memory device with a self-aligned via contact as claimed in claim 9 wherein the step of forming the circuit on the substrate includes a step of fabricating the circuit under a process for a complimentary metal oxide semiconductor.

13. A method of fabricating a magnetoresistive random access memory device with a self-aligned via contact as claimed in claim 9 wherein the surface of the conductive layer is created by using chemical mechanical polishing.

14. A method of fabricating a magnetoresistive random access memory device with a self-aligned via contact as claimed in claim 9 wherein the step of using the electrochemical deposition bath includes using one of electroless plating and immersion.

15. A method of fabricating a magnetoresistive random access memory device with a self-aligned via contact as claimed in claim 9 wherein the step of removing a portion of the second dielectric layer includes using one of chemical mechanical polishing.

16. A method of fabricating a magnetoresistive random access memory device with a self-aligned via contact as claimed in claim 9 wherein the metal cap includes one of titanium-tungsten, tungsten, tantalum, tantalum nitride, and aluminum.

17. A method of fabricating a magnetoresistive random access memory device with a self-aligned via contact as claimed in claim 9 wherein the bump metal layer includes a material more noble than the material included in the metal cap.

18. A method of fabricating a magnetoresistive random access memory device with a self-aligned via contact as claimed in claim 9 wherein the step of forming the digit line includes a step of forming a flux concentrating layer around the digit line except a surface toward the magnetoresistive random access memory device.

19. A method of fabricating a magnetoresistive random access memory device with a self-aligned via contact as claimed in claim 9 including in addition the step of depositing a third dielectric layer positioned on the second dielectric layer and the bump metal layer.

20. A method of fabricating a magnetoresistive random access memory device with a self-aligned via contact as claimed in claim 9 including in addition the step of forming a bit line positioned on the surface of the bump metal layer, the bit line being oriented perpendicular to the digit line.

21. A method of fabricating a magnetoresistive random access memory device with a self-aligned via contact as claimed in claim 20 wherein the step of forming the bit line includes a step of forming a flux concentrating layer around the bit line except a surface toward the magnetoresistive random access memory device.

22. A method of fabricating a magnetoresistive random access memory device with a self-aligned via contact and control circuitry, the method comprising the steps of:

providing a substrate on which the magnetoresistive random access memory device and the control circuitry are formed;

forming the control circuitry including a digit line positioned on the substrate;

forming a first dielectric layer positioned on the control circuitry and the digit line;

forming a trench in the first dielectric layer and proximate to the digit line;

forming a conductive layer within the trench wherein the conductive layer is electrically connected to the control circuitry by a metal conductive via, the conductive layer having a flat surface and wherein a portion of the conductive layer is positioned on the first dielectric layer wherein the first dielectric layer separates the digit line and the conductive layer;

forming a magnetoresistive random access memory device with a surface, the memory device positioned on the flat surface of the conductive layer wherein the memory device is coupled to the digit line, the magnetoresistive random access memory device including a metal cap positioned on the surface;

using an electrochemical deposition both to form a bump metal layer positioned on the flat surface of the metal cap;

depositing a second dielectric layer positioned on the conductive layer and the bump metal layer;

removing a portion of the second dielectric layer to expose a flat surface of the bump metal layer; and forming a bit line positioned on the surface of the bump metal layer.

23. A method of fabricating a magnetoresistive random access memory device with a self-aligned via contact as claimed in claim 22 wherein the step of forming the magnetoresistive random access memory device includes the steps of:

depositing a pinned synthetic anti-ferromagnetic region positioned on the flat surface of the conductive layer;

depositing a non-ferromagnetic spacer layer positioned on the pinned synthetic anti-ferromagnetic region;

depositing a free ferromagnetic region positioned on the non-ferromagnetic spacer layer.

24. A method of fabricating a magnetoresistive random access memory device with a self-aligned via contact as claimed in claim 23 wherein the step of depositing a non-ferromagnetic spacer layer includes a step of forming a tunneling junction between the pinned synthetic anti-ferromagnetic region and the free ferromagnetic region.

25. A method of fabricating a magnetoresistive random access memory device with a self-aligned via contact as claimed in claim 22 wherein the step of forming the control circuitry on the substrate includes a step of fabricating the circuit under a process for a complimentary metal oxide semiconductor.

26. A method of fabricating a magnetoresistive random access memory device with a self-aligned via contact as claimed in claim 22 wherein the flat surface of the conductive layer is formed by using one of chemical mechanical polishing.

27. A method of fabricating a magnetoresistive random access memory device with a self-aligned via contact as claimed in claim 22 wherein the step of using the electrochemical deposition bath includes using one of electroless plating and immersion.

28. A method of fabricating a magnetoresistive random access memory device with a self-aligned via contact as claimed in claim 22 wherein the step of removing a portion of the second dielectric layer includes using chemical mechanical polishing.

29. A method of fabricating a magnetoresistive random access memory device with a self-aligned via contact as claimed in claim 22 wherein the metal cap includes one of titanium-tungsten, tungsten, tantalum, tantalum nitride, and aluminum.

30. A method of fabricating a magnetoresistive random access memory device with a self-aligned via contact as claimed in claim 22 wherein the bump metal layer includes a material more noble than the material included in the metal cap.

31. A method of fabricating a magnetoresistive random access memory device with a self-aligned via contact as claimed in claim 22 wherein the step of forming the digit line includes a step of forming a flux concentrating layer around the digit line except a surface toward the magnetoresistive random access memory.

32. A method of fabricating a magnetoresistive random access memory device with a self-aligned via contact as claimed in claim 22 wherein the step of forming the bit line includes a step of forming a flux concentrating layer around the bit line except a surface toward the magnetoresistive random access memory device.

* * * * *